(12) United States Patent
 Higuchi

(10) Patent No.: US 11,450,530 B2
(45) Date of Patent: Sep. 20, 2022

(54) SUBSTRATE PROCESSING APPARATUS AND SUBSTRATE PROCESSING METHOD

(71) Applicant: Tokyo Electron Limited, Tokyo (JP)

(72) Inventor: Rintaro Higuchi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 17/206,289

(22) Filed: Mar. 19, 2021

(65) Prior Publication Data

US 2021/0305053 A1 Sep. 30, 2021

(30) Foreign Application Priority Data

Mar. 30, 2020 (JP) .............................. JP2020-059587

(51) Int. Cl.

| | |
|---|---|
| *H01L 21/3063* | (2006.01) |
| *H01L 21/67* | (2006.01) |
| *H01L 21/3213* | (2006.01) |
| *H01L 21/465* | (2006.01) |
| *H01L 21/308* | (2006.01) |
| *B23H 3/04* | (2006.01) |

(Continued)

(52) U.S. Cl.
 CPC ........ *H01L 21/3063* (2013.01); *H01L 21/308* (2013.01); *H01L 21/32134* (2013.01); *H01L 21/465* (2013.01); *H01L 21/67017* (2013.01); *H01L 21/67075* (2013.01); *B23H 3/04* (2013.01); *B23H 7/26* (2013.01); *B23H 7/32* (2013.01); *B23H 7/36* (2013.01); *C25F 7/00* (2013.01)

(58) Field of Classification Search
 CPC ..... C25F 7/00; C25F 3/12; C25F 3/14; C25D 17/001; H01L 21/3063; H01L 21/32134; H01L 21/308; H01L 21/6708; H01L 21/02087; H01L 21/465; H01L 21/467
 See application file for complete search history.

(56) References Cited

U.S. PATENT DOCUMENTS

| | | | |
|---|---|---|---|
| 2005/0218003 A1* | 10/2005 | Wang ................... | C25D 17/001 205/157 |
| 2007/0131561 A1* | 6/2007 | Wang ..................... | B24B 49/00 205/652 |

(Continued)

FOREIGN PATENT DOCUMENTS

WO 2016/068183 A1 5/2016

*Primary Examiner* — Nicholas A Smith
(74) *Attorney, Agent, or Firm* — Pearne & Gordon LLP

(57) ABSTRACT

A substrate processing apparatus includes a substrate rotator, a processing liquid supply, an anode and a cathode, and a controller. The substrate rotator is configured to hold and rotate a substrate. The processing liquid supply is configured to supply a processing liquid to the substrate held by the substrate rotator. The anode and the cathode are configured to apply a voltage to the processing liquid supplied from the processing liquid supply. The controller is configured to control the substrate rotator, the processing liquid supply, and the anode and the cathode. The controller allows, by contacting the anode and the cathode with the processing liquid independently, the processing liquid in contact with the anode and the processing liquid in contact with the cathode to be supplied to the substrate while being spaced apart from each other when the substrate is rotated.

12 Claims, 10 Drawing Sheets

(51) Int. Cl.
*B23H 7/26* (2006.01)
*B23H 7/32* (2006.01)
*C25F 7/00* (2006.01)
*B23H 7/36* (2006.01)

(56) References Cited

U.S. PATENT DOCUMENTS

2016/0115613 A1* 4/2016 Wang .................. C25D 17/005
　　　　　　　　　　　　　　　　　　　　　205/123
2017/0222138 A1　 8/2017 Park et al.
2018/0291521 A1* 10/2018 Tsuji ..................... C25D 17/06

* cited by examiner

FIG. 5
| | ETCHING QUALITY |
|---|---|
| PRESENCE OF GAP | ○ |
| ABSENCE OF GAP | △ |
FIG. 6
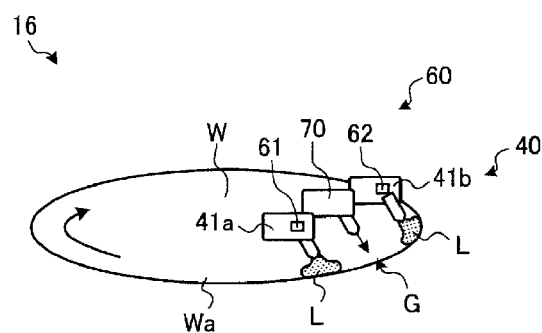
FIG. 7
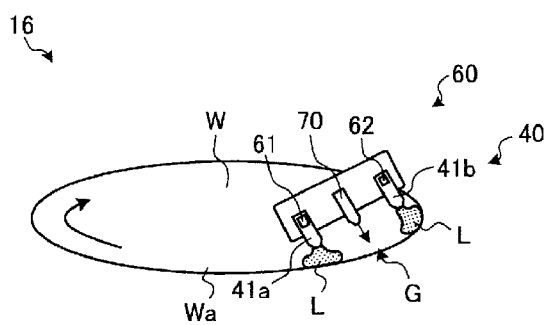

|  | ETCHING QUALITY |
|---|---|
| RADIATE LIGHT TO ANODE SIDE AND CATHODE SIDE | ◎ |
| RADIATE LIGHT ONLY TO ANODE SIDE | ○ |
| RADIATE LIGHT ONLY TO CATHODE SIDE | × |
| NO LIGHT RADIATION | × |

SUBSTRATE PROCESSING APPARATUS AND SUBSTRATE PROCESSING METHOD

CROSS-REFERENCE TO RELATED APPLICATION

This application claims the benefit of Japanese Patent Application No. 2020-059587 filed on Mar. 30, 2020, the entire disclosure of which is incorporated herein by reference.

TECHNICAL FIELD

The various aspects and embodiments described herein pertain generally to a substrate processing apparatus and a substrate processing method.

BACKGROUND

Conventionally, there is known a technique of etching a noble metal film such as a ruthenium (Ru) film formed on a substrate such as a semiconductor wafer (hereinafter, also referred to as wafer) (see, for example, Patent Document 1).
Patent Document 1: International Publication No. 2016/068183

SUMMARY

In one exemplary embodiment, a substrate processing apparatus includes a substrate rotator, a processing liquid supply, an anode and a cathode, and a controller. The substrate rotator is configured to hold and rotate a substrate. The processing liquid supply is configured to supply a processing liquid to the substrate held by the substrate rotator. The anode and the cathode are configured to apply a voltage to the processing liquid supplied from the processing liquid supply. The controller is configured to control the substrate rotator, the processing liquid supply, and the anode and the cathode. The controller allows, by contacting the anode and the cathode with the processing liquid independently, the processing liquid in contact with the anode and the processing liquid in contact with the cathode to be supplied to the substrate while being spaced apart from each other when the substrate is rotated.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is a diagram showing quality of the etching processing;

FIG. 6 is a diagram illustrating a configuration of a processing liquid supply and a voltage applying unit within a processing unit according to a first modification example of the exemplary embodiment;

FIG. 7 is a diagram illustrating a configuration of a processing liquid supply and a voltage applying unit within a processing unit according to a second modification example of the exemplary embodiment;

DETAILED DESCRIPTION

Figure 1:
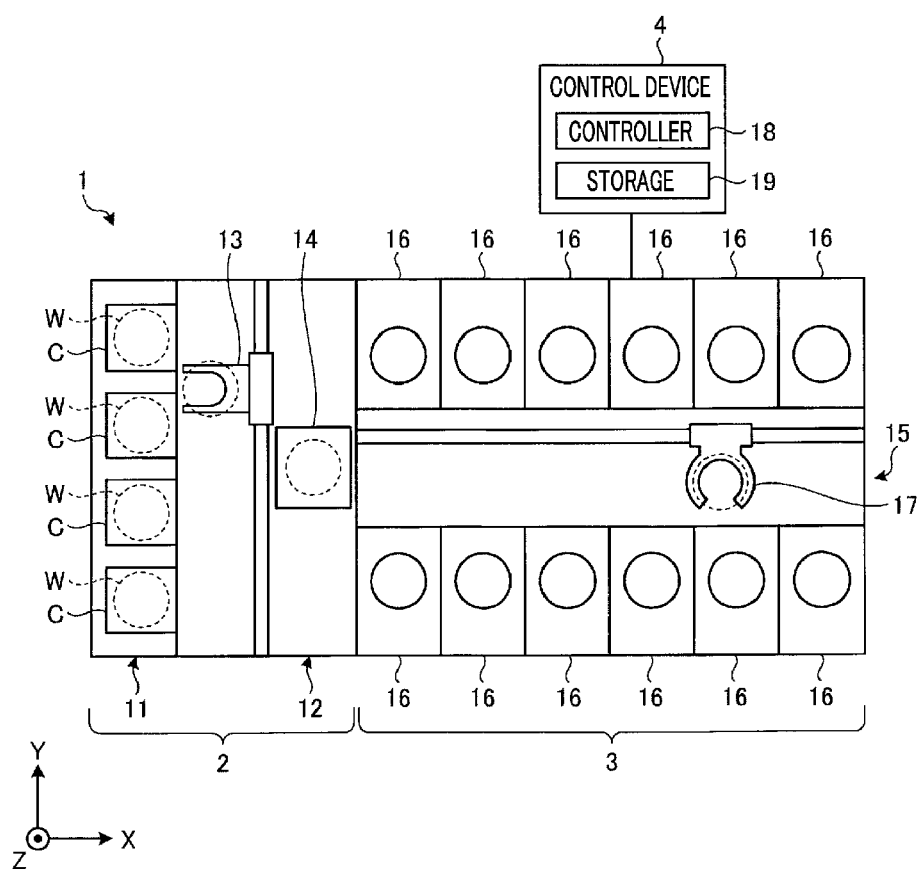
FIG. 1 is a schematic diagram illustrating a schematic configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a substrate processing method according to the present disclosure will be described in detail with reference to the accompanying drawings. Further, the present disclosure is not limited by the exemplary embodiments to be described below. Also, it should be noted that the drawings are schematic and relations in sizes of individual components and ratios of the individual components may sometimes be different from actual values. Even between the drawings, there may exist parts having different dimensional relationships or different ratios.

Conventionally, there is known a technique of etching a noble metal film such as a ruthenium film formed on a substrate such as a semiconductor wafer (hereinafter, also referred to as wafer). In the prior art, however, there is still a room for improvement in increasing an etching rate of the noble metal film.

Thus, there is a demand for realizing a technique capable of etching the noble metal film on the substrate efficiently to solve the aforementioned problem.

<Outline of Substrate Processing System>

First, referring to FIG. 1, a schematic configuration of a substrate processing system 1 according to an exemplary embodiment will be discussed. FIG. 1 is a diagram illustrating the schematic configuration of the substrate processing system 1 according to the exemplary embodiment. Further, the substrate processing system 1 is an example of a cleaning apparatus. In the following, in order to clarity positional relationship, the X-axis, the Y-axis and the Z-axis which are orthogonal to each other will be defined, and the positive Z-axis direction will be regarded as a vertically upward direction.

As depicted in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. A plurality of carriers C each of which accommodates therein a plurality of wafers W (hereinafter, referred to as wafers) horizontally is provided in the carrier placing section 11.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. These processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing unit 16 is configured to perform a predetermined substrate processing on the wafers W transferred by the substrate transfer device 17.

Further, the substrate processing system 1 is equipped with a control device 4. The control device 4 is, for example, a computer, and includes a controller 18 and a storage 19. The storage 19 stores a program that controls various processings performed in the substrate processing system 1. The controller 18 controls the operations of the substrate processing system 1 by reading and executing the program stored in the storage 19.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magneto optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. The processed wafer W placed on the delivery unit 14 is then returned to the carrier C of the carrier placing section 11 by the substrate transfer device 13.

<Configuration of Processing Unit>

Figure 2:
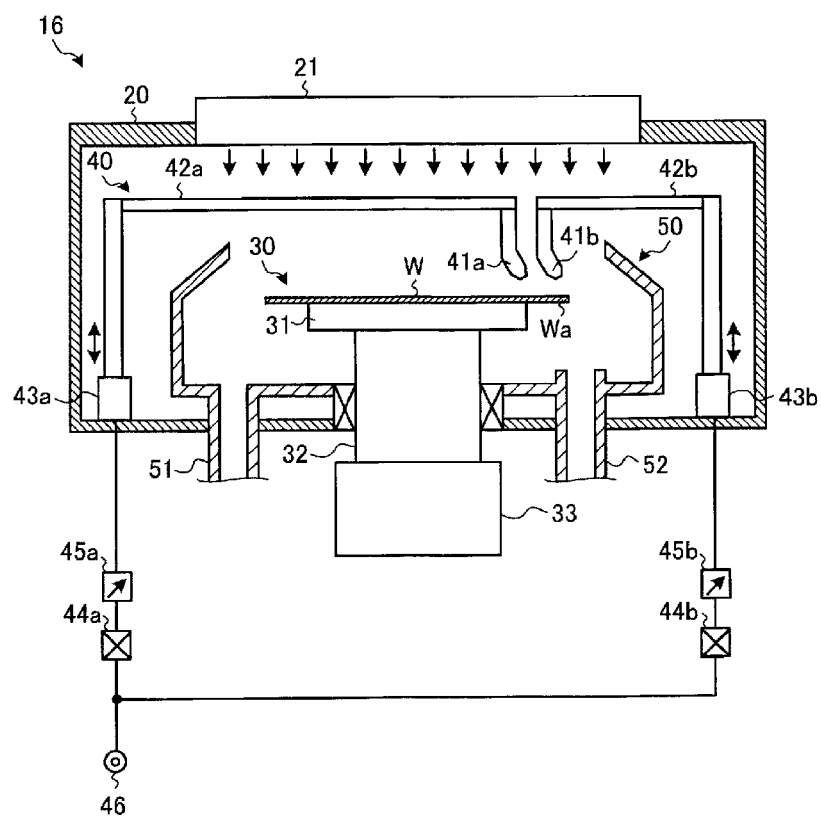
FIG. 2 is a schematic diagram illustrating a specific configuration example of a processing unit.

Now, a configuration of the processing unit 16 will be described with reference to FIG. 2. FIG. 2 is a schematic diagram illustrating a specific configuration example of the processing unit 16. As depicted in FIG. 2, the processing unit 16 includes a chamber 20, a substrate rotator 30, a processing liquid supply 40, and a recovery cup 50. Further, as will be described in detail later, the processing unit 16 further includes a voltage applying unit 60 (see FIG. 3).

The chamber 20 accommodates therein the substrate rotator 30, the processing liquid supply 40, and the recovery cup 50. A FFU (Fan Filter Unit) 21 is provided at a ceiling of the chamber 20. The FFU 21 forms a downflow within the chamber 20.

The substrate rotator 30 is equipped with a holder 31, a supporting column 32 and a driving unit 33, and configured to hold and rotate the wafer W. The holder 31 is configured to attract a bottom surface of the wafer W and hold this wafer W horizontally.

The supporting column 32 is a vertically extending member. A base end of the supporting column 32 is rotatably supported by the driving unit 33, and a leading end of the supporting column 32 supports the holder 31 horizontally. The driving unit 33 rotates the supporting column 32 around a vertical axis.

The substrate rotator 30 having the above-described configuration rotates the holder 31 supported on the supporting column 32 by rotating the supporting column 32 through the driving unit 33, thus allowing the wafer W held by the holder 31 to be rotated.

The processing liquid supply 40 is configured to supply a processing liquid L (see FIG. 3) onto a peripheral portion Wa of the wafer W or the like. The processing liquid supply 40 is equipped with a plurality of (here, two) nozzles 41a and 41b; arms 42a and 42b configured to respectively support the nozzles 41a and 41 horizontally; and rotating/elevating devices 43a and 43b configured to rotate and elevate the arms 42a and 42b, respectively.

The nozzle 41a is connected to a processing liquid source 46 via a valve 44a and a flow rate controller 45a. Further, the nozzle 41b is connected to the processing liquid source 46 via a valve 44b and a flow rate controller 45b.

The processing liquid L supplied from the processing liquid source 46 is an acidic aqueous solution, a neutral aqueous solution or an alkaline aqueous solution. The acidic aqueous solution used as this processing liquid L may be hydrochloric acid (HCl), nitric acid ($HNO_3$), sulfuric acid ($H_2SO_4$), or the like. Further, the neutral aqueous solution used as the processing liquid L may be a sodium chloride (NaCl) aqueous solution, a potassium chloride (KCl) aqueous solution, or the like.

Further, the alkaline aqueous solution used as the processing liquid L may be a TMAH (Tetra Methyl Ammonium Hydroxide) or sodium hydroxide (NaOH) aqueous solution, a potassium hydroxide (KOH) aqueous solution, an ammonia ($NH_3$) aqueous solution, or the like.

Furthermore, the processing liquid L may be an organic solvent including an electrolyte (for example, a liquid in which a salt such as perchlorate is added to an organic solvent such as alcohol or hydrocarbon).

The nozzle 41a and the nozzle 41b are configured to discharge the processing liquid L supplied from the processing liquid source 46 to required positions on the peripheral portion Wa of the wafer W individually.

The recovery cup 50 is disposed to surround the holder 31, and collects the processing liquid L scattered from the wafer W by the rotation of the holder 31. A drain port 51 is formed at a bottom of the recovery cup 50, and the processing liquid L collected by the recovery cup 50 is drained from the drain port 51 to an outside of the processing unit 16. Further, an exhaust port 52 is formed at the bottom of the recovery cup 50 to exhaust the gas supplied from the FFU 21 to the outside of the processing unit 16.

<Configuration of Processing Liquid Supply and Voltage Applying Unit>

Figure 3:
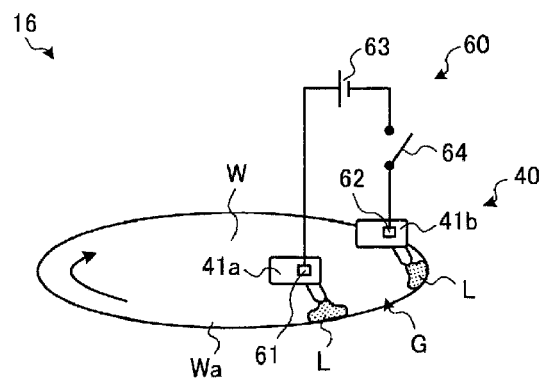
FIG. 3 is a diagram illustrating a configuration of a processing liquid supply and a voltage applying unit within the processing unit according to the exemplary embodiment.

Now, a configuration of the processing liquid supply 40 and the voltage applying unit 60 within the processing unit 16 according to the exemplary embodiment will be explained with reference to FIG. 3 to FIG. 5. FIG. 3 is a diagram illustrating the configuration of the processing liquid supply 40 and the voltage applying unit 60 within the processing unit 16 according to the exemplary embodiment.

The controller 18 (see FIG. 1) discharges, by using the nozzles 41a and 41b of the processing liquid supply 40, the processing liquid L to preset positions of the peripheral portion Wa of the wafer W being rotated, as illustrated in FIG. 3. In the present exemplary embodiment, the processing liquid L from the nozzles 41a and 41b are discharged to reach the peripheral portion Wa of the wafer W without being cut on the way.

Further, the processing unit 16 according to the exemplary embodiment is equipped with the voltage applying unit 60 configured to apply a voltage to the processing liquid L which is supplied to the peripheral portion Wa of the wafer W. This voltage applying unit 60 includes an anode 61, a cathode 62, a DC power supply 63, and a switch 64.

The anode 61 is provided inside the nozzle 41a and applies a preset positive voltage to the processing liquid L flowing in the nozzle 41a. The cathode 62 is provided inside the nozzle 41b and applies a preset negative voltage to the processing liquid L flowing in the nozzle 41b.

Further, the anode 61 is connected to a positive pole of the DC power supply 63, and the cathode 62 is connected to a negative pole of the DC power supply 63 via the switch 64. By turning the switch 64 into an on state, the controller 18 is capable of applying the preset positive voltage to the anode 61 and the preset negative voltage to the cathode 62.

In the present exemplary embodiment, since the processing liquid L from the nozzle 41a is discharged up to the peripheral portion Wa of the wafer W without being cut on the way, the required positive voltage is applied to the peripheral portion Wa of the wafer W via the processing liquid L.

Likewise, in the exemplary embodiment, since the processing liquid L from the nozzle 41b is discharged up to the peripheral portion Wa of the wafer W without being cut on the way, the preset negative voltage is applied to the peripheral portion Wa of the wafer W via the processing liquid L.

Here, in the exemplary embodiment, the processing liquid L discharged from the nozzle 41a and the processing liquid L discharged from the nozzle 41b are arranged apart from each other at the peripheral portion Wa of the wafer W being rotated. That is, at the peripheral portion Wa of the wafer W being rotated, a gap G is provided between the processing liquid L discharged from the nozzle 41a and the processing liquid L discharged from the nozzle 41b.

An effect of this gap G will be described with reference to FIG. 4 and FIG. 5. FIG. 4 is a diagram for describing a mechanism of an etching processing according to the exemplary embodiment. The example of FIG. 4 will be described for a case where the hydrochloric acid is used as the processing liquid L and the wafer W has a ruthenium film formed on a surface thereof.

Figure 4:
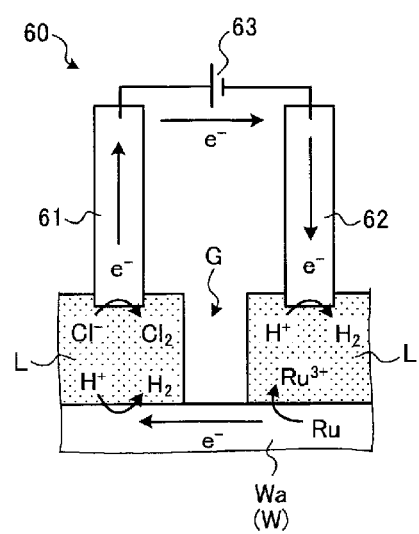
FIG. 4 is a diagram for describing a mechanism of an etching processing according to the exemplary embodiment.

As depicted in FIG. 4, a reduction reaction of a hydrogen ion ($H^+$) in the processing liquid L takes place at an interface between the cathode 62 and the processing liquid L due to an electron supplied to the cathode 62 from the negative pole of the DC power supply 63.

Further, at an interface between the processing liquid L in contact with the cathode 62 and the wafer W, ruthenium is ionized by anodic oxidation, and this ionized ruthenium ($Ru^{3+}$) is eluted into the processing liquid L. Accordingly, since the ruthenium film formed on the surface of the wafer W is etched electrochemically, the ruthenium film can be etched efficiently.

Further, an electron generated by this anodic oxidation is supplied via the wafer W into the processing liquid L which is in contact with the anode 61. Due to this electron, a reduction reaction of a hydrogen ion ($H^+$) in the processing liquid L takes place at an interface between the wafer W and the processing liquid L in contact with the anode 61.

Furthermore, an oxidation reaction of a chlorine ion ($Cl^-$) in the processing liquid L takes place at an interface between the anode 61 and the processing liquid L. An electron generated by this oxidation reaction is supplied to the cathode 62 via the anode 61 and the DC power supply 63. The various kinds of the reactions described so far are repeated.

Here, if the gap G is not provided between the processing liquid L discharged from the nozzle 41a and the processing liquid L discharged from the nozzle 41b, the electron generated in the processing liquid L in contact with the cathode 62 is supplied to the anode 61 via the processing liquid L rather than via the wafer W.

It is because the ruthenium film formed on the wafer W has a comparatively small thickness (about several tens of nanometers), and, thus, an electric resistance thereof is considerably large. That is, it is easier for the electron to flow in the processing liquid L.

Accordingly, at the interface between the processing liquid L in contact with the cathode 62 and the wafer W, a rate at which the ruthenium is anodically oxidized is lowered. That is, if the gap G is not provided, it is difficult to improve an etching rate of the ruthenium film.

In the exemplary embodiment, however, since the gap G is provided between the processing liquid L discharged from the nozzle 41a and the processing liquid L discharged from the nozzle 41b, the electron generated at the interface between the cathode 62 and the processing liquid L is supplied to the anode 61 via the wafer W. Accordingly, the rate at which the ruthenium on the surface of the wafer W is anodically oxidized can be increased.

Thus, according to the exemplary embodiment, by providing the gap G, a noble metal film (here, the ruthenium film) on the wafer W can be efficiently etched, as illustrated in FIG. 5. FIG. 5 is a diagram showing quality of the etching processing according to the exemplary embodiment.

Further, though the above exemplary embodiment has been described for the example where the ruthenium film is electrochemically etched with the hydrochloric acid, the noble metal film on which the etching processing of the exemplary embodiment is performed is not limited to the ruthenium film. Moreover, the processing liquid L used in the etching processing is not limited to the hydrochloric acid, either.

Various Modification Examples

Now, various modification examples of the exemplary embodiment will be described with reference to FIG. 6 to FIG. 18. In the various modification examples to be described below, parts which are the same as those of the exemplary embodiment will be assigned same reference numerals, and redundant description thereof will be omitted.

FIG. 6 is a diagram illustrating a configuration of a processing liquid supply 40 and a voltage applying unit 60 within a processing unit 16 according to a first modification example of the exemplary embodiment. In the following drawings, illustration of the DC power supply 63 and the switch 64 of the voltage applying unit 60 may sometimes be omitted.

As shown in FIG. 6, the first modification example is difference from the exemplary embodiment in that a gas nozzle 70 is additionally provided in the processing unit 16. This gas nozzle 70 is configured to discharge a gas such as nitrogen gas or air to the gap between the processing liquid L discharged from the nozzle 41a and the processing liquid L discharged from the nozzle 41b.

In the first modification example, by this gas nozzle 70, the gap G between the processing liquid L discharged from the nozzle 41a and the processing liquid L discharged from the nozzle 41b can be formed more securely. Thus, according to the first modification example, the noble metal film on the wafer W can be etched more efficiently.

Further, in the example of FIG. 6, the gas nozzle 70 is configured as a separate body from the nozzles 41a and 41b. However, the configuration of the gas nozzle 70 is not limited thereto. FIG. 7 is a diagram illustrating a configuration of a processing liquid supply 40 and a voltage applying unit 60 within a processing unit 16 according to a second modification example of the exemplary embodiment.

As depicted in FIG. 7, a gas nozzle 70 may be configured as one body with the nozzle 41a and 41b. Accordingly, the gas can be discharged to the gap between the processing liquid L discharged from the nozzle 41a and the processing liquid L discharged from the nozzle 41b more securely.

Figure 8:
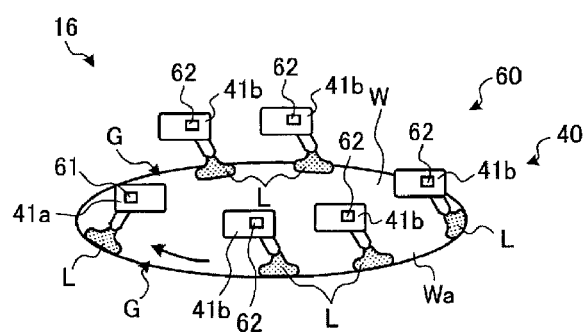
FIG. 8 is a diagram illustrating a configuration of a processing liquid supply and a voltage applying unit within a processing unit according to a third modification example of the exemplary embodiment.

FIG. 8 is a diagram illustrating a configuration of a processing liquid supply 40 and a voltage applying unit 60 within a processing unit 16 according to a third modification example of the exemplary embodiment. As shown in FIG. 8, a plurality of (five in the drawing) nozzles 41b each of which has the cathode 62 is provided within the processing unit 16, and the processing liquid L may be discharged to the peripheral portion Wa of the wafer W from the plurality of nozzles 41b individually.

In this configuration as well, by providing the gaps G between the processing liquid L discharged from the nozzle 41a and the processing liquid L discharged from the nozzle 41b, the noble metal film on the wafer W can be etched efficiently.

Further, in the third modification example, since the number of positions where the noble metal film is electrochemically etched (that is, positions to which the processing liquid L is discharged from the nozzle 41b) can be increased, the noble metal film on the wafer W can be etched more efficiently.

Additionally, though the example of FIG. 8 has been described for the case where the processing liquids L discharged from the adjacent nozzles 41b are arranged apart from each other, the processing liquids L discharged from the adjacent nozzles 41b may not necessarily be distanced apart from each other.

By way of example, by allowing the processing liquids L discharged from the adjacent nozzles 41b to be in contact with each other, the noble metal film can be uniformly etched within these processing liquids L in contact with each other.

Figure 9:
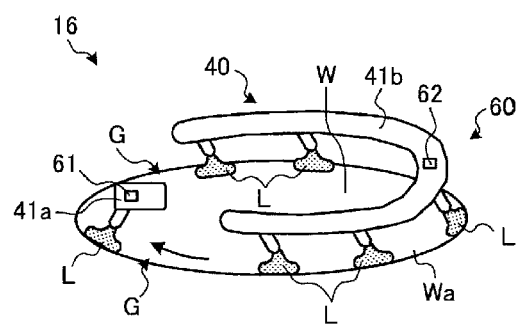
FIG. 9 is a diagram illustrating a configuration of a processing liquid supply and a voltage applying unit within a processing unit according to a fourth modification example of the exemplary embodiment.

Furthermore, in the example of FIG. 8, the processing liquid L is discharged to the multiple positions by using the plurality of nozzles 41b. However, the configuration of the nozzles 41b is not limited thereto. FIG. 9 is a diagram illustrating a configuration of a processing liquid supply 40 and a voltage applying unit 60 within a processing unit 16 according to a fourth modification example of the exemplary embodiment.

As illustrated in FIG. 9, a single nozzle 41b provided with the cathode 62 has a plurality of (five in the drawing) discharge openings, and the processing liquid L may be discharged to the peripheral portion Wa of the wafer W from the plurality of discharge openings individually. Accordingly, the number of positions where the noble metal film is etched electrochemically can also be increased, and, thus, the noble metal film on the wafer W can be etched more efficiently.

In the examples describe so far, the anode 61 and the cathode 62 are provided inside the nozzle 41a and the nozzle 41b, respectively. However, the layout of the anode 61 and the cathode 62 may not be limited thereto.

Figure 10:
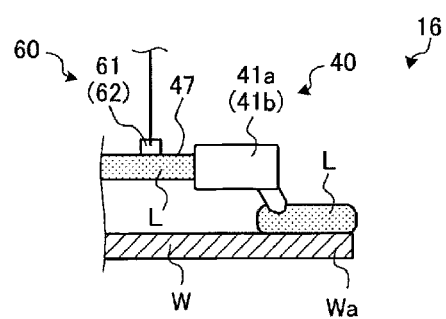
FIG. 10 is a diagram illustrating a configuration of a processing liquid supply and a voltage applying unit within a processing unit according to a fifth modification example of the exemplary embodiment.

FIG. 10 is a diagram illustrating a configuration of a processing liquid supply 40 and a voltage applying unit 60 within a processing unit 16 according to a fifth modification example of the exemplary embodiment. In each of FIG. 10 to FIG. 15 to be described below, a layout of the anode 61 in the nozzle 41b and a layout of the cathode 62 in the nozzle 41b are illustrated in the one and the same drawing.

Further, in the examples of FIG. 10 to FIG. 15, since the layout of the cathode 62 in the nozzle 41b is the same as the layout of the anode 61 in the nozzle 41a, description upon the layout of the cathode 62 in the nozzle 41b will be omitted.

As shown in FIG. 10, the anode 61 may be provided in a conductive line 47 through which the processing liquid L is supplied to the nozzle 41a. With this configuration as well, a preset positive voltage can be applied to the processing liquid L flowing in the conductive line 47 and the nozzle 41a.

Thus, according to the fifth modification example, the preset positive voltage can be applied to the processing liquid L which is supplied to the peripheral portion Wa of the wafer W from the nozzle 41a. As an example, a pipeline having conductivity by adding conductive powder such as carbon to a resin material may be used as the conductive line 47.

Figure 11:
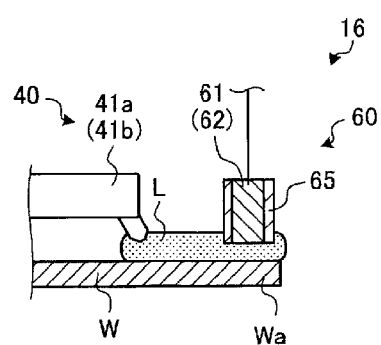
FIG. 11 is a diagram illustrating a configuration of a processing liquid supply and a voltage applying unit within a processing unit to a sixth modification example of the exemplary embodiment.

FIG. 11 is a diagram illustrating a configuration of a processing liquid supply 40 and a voltage applying unit 60 within a processing unit 16 according to a sixth modification example of the exemplary embodiment will be explained. As shown in FIG. 11, the anode 61 may be disposed to be in direct contact with the processing liquid L after being discharged to the peripheral portion Wa of the wafer W from the nozzle 41a.

With this configuration as well, it is possible to apply a preset positive voltage to the processing liquid L supplied to the peripheral portion Wa of the wafer W from the nozzle 41a. Further, in case that the anode 61 is disposed to be in direct contact with the processing liquid L after being discharged to the peripheral portion Wa, a cover 65 may be disposed to cover a side surface of the anode 61.

In the examples described so far, the processing liquid L is discharged directly to the peripheral portion Wa of the wafer W from the nozzle 41a. However, the processing liquid L may be retained in a liquid retaining member, and the processing liquid L in this retained state may come into contact with the peripheral portion Wa of the wafer W.

Figure 12:
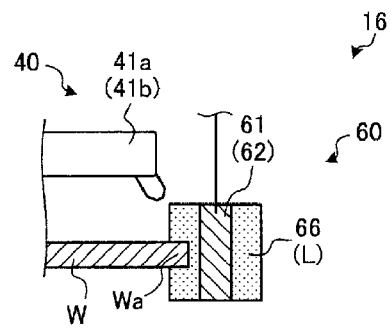
FIG. 12 is a diagram illustrating a configuration of a processing liquid supply and a voltage applying unit within a processing unit according to a seventh modification example of the exemplary embodiment.

FIG. 12 is a diagram illustrating a configuration of a processing liquid supply 40 and a voltage applying unit 60 within a processing unit 16 according to a seventh modification example of the exemplary embodiment. FIG. 12 illustrates an example where a porous member 66 is used as an example of the liquid retaining member capable of retaining the processing liquid L. This porous member 66 may be, by way of non-limiting example, a sponge, and is disposed to be wound around a side surface of an anode 61.

In this seventh modification example, the processing liquid L is discharged to the porous member 66 from the nozzle 41a to be retained by this porous member 66. By bringing the porous member 66 retaining the processing liquid L into contact with the peripheral portion Wa of the wafer W, a preset positive voltage can be applied to the processing liquid L which is supplied to the peripheral portion Wa of the wafer W.

Further, in the seventh modification example, since the etching processing upon the peripheral portion Wa can be performed with the processing liquid L retained by the porous member 66, a consumption amount of the processing liquid L can be reduced.

Figure 13:
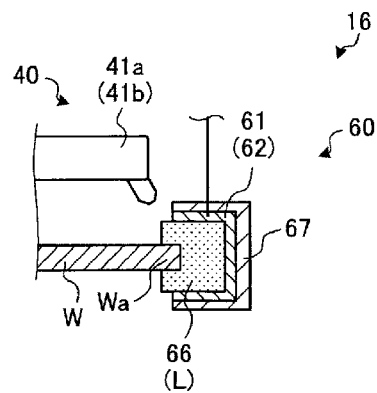
FIG. 13 is a diagram illustrating a configuration of a processing liquid supply and a voltage applying unit within a processing unit according to an eighth modification example of the exemplary embodiment.

FIG. 13 is a diagram illustrating a configuration of a processing liquid supply 40 and a voltage applying unit 60 within a processing unit 16 according to an eighth modification example of the exemplary embodiment. As depicted in FIG. 13, most of the porous member 66 may be covered with a cover 67, and the node 61 may be disposed between the cover 67 and the porous member 66.

With this configuration as well, by bringing an exposed portion of the porous member 66 retaining the processing liquid L into contact with the peripheral portion Wa of the wafer W, a preset positive voltage can be applied to the processing liquid L which is supplied to the peripheral portion Wa of the wafer W.

Further, in the eighth modification example, since the etching processing upon the peripheral portion Wa of the wafer W can be performed with the processing liquid L retained by the porous member 66, the consumption amount of the processing liquid L can be reduced.

Figure 14:
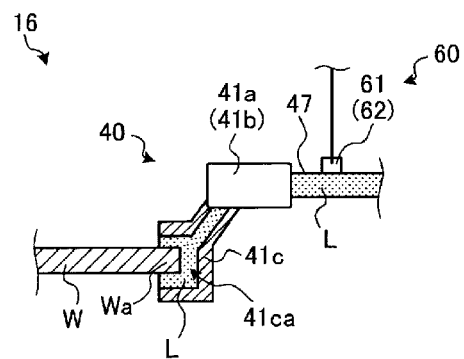
FIG. 14 is a diagram illustrating a configuration of a processing liquid supply and a voltage applying unit within a processing unit according to a ninth modification example of the exemplary embodiment.

Furthermore, in the examples of FIG. 12 and FIG. 13, the porous member 66 is used as the liquid retaining member. However, the liquid retaining member according to the exemplary embodiment is not limited to the porous member 66. FIG. 14 is a diagram illustrating a configuration of a processing liquid supply 40 and a voltage applying unit 60 within a processing unit 16 according to a ninth exemplary embodiment of the exemplary embodiment.

As depicted in FIG. 14, in the ninth modification example, a liquid retainer 41c is provided at a discharge opening of the nozzle 41a. This liquid retainer 41c is another example of the liquid retaining member, and has a substantially C-shape on a cross section thereof. In the liquid retainer 41c, by using a surface tension of the processing liquid L, the processing liquid L can be retained within a recess 41ca.

Further, in the ninth modification example, the anode 61 is provided at the conductive line 47 through which the processing liquid L is supplied to the nozzle 41a. That is, in the ninth modification example, the anode 61 is in indirect contact with the processing liquid L retained by the liquid retainer 41c.

Moreover, as illustrated in FIG. 14, by inserting the peripheral portion Wa of the wafer W into the recess 41ca of the liquid retainer 41c, it is possible to apply a preset positive voltage to the processing liquid L around the peripheral portion Wa of the wafer W.

In addition, in the ninth modification example, since the etching processing upon the peripheral portion Wa can be performed with the processing liquid L retained by the liquid retainer 41c, the consumption amount of the processing liquid L can be reduced.

Figure 15:
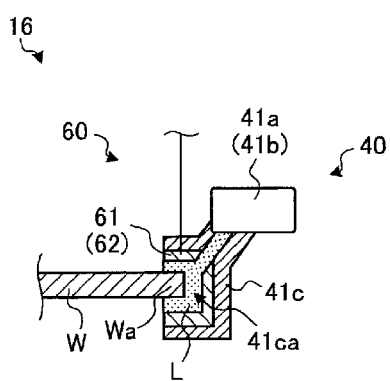
FIG. 15 is a diagram illustrating a configuration of a processing liquid supply and a voltage applying unit within a processing unit according to a tenth modification example of the exemplary embodiment.

Furthermore, though the anode 61 is provided at the conductive line 47 in the example of FIG. 14, a layout of the anode 61 is not limited to this example. FIG. 15 is a diagram illustrating a configuration of a processing liquid supply 40 and a voltage applying unit 60 within a processing unit 16 according to a tenth modification example of the exemplary embodiment.

As depicted in FIG. 15, in the tenth modification example, the anode 61 is provided inside the recess 41ca formed at the liquid retainer 41c. With this configuration as well, it is possible to apply a preset positive voltage to the processing liquid L which is supplied to the peripheral portion Wa of the wafer W.

Further, in the tenth modification example, since the etching processing of the peripheral portion Wa can be performed with the processing liquid L held by the liquid retainer 41c, the consumption amount of the processing liquid L can be reduced.

Figures 16, 17:
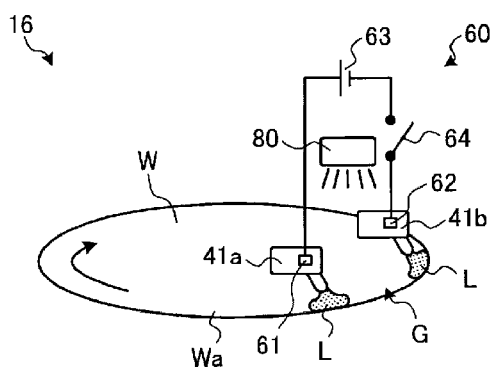
FIG. 16 is a diagram illustrating a configuration of a processing liquid supply and a voltage applying unit within a processing unit according to an eleventh modification example of the exemplary embodiment.
FIG. 17 is a diagram showing quality of an etching processing according to the eleventh modification of the exemplary embodiment.

FIG. 16 is a diagram illustrating a configuration of a processing liquid supply 40 and a voltage applying unit 60 within a processing unit 16 according to an eleventh modification example of the exemplary embodiment. As depicted in FIG. 16, the eleventh modification example is different from the exemplary embodiment in that the processing unit 16 is additionally equipped with a light source 80.

This light source 80 is configured to radiate light to the processing liquid L discharged from the nozzles 41a and 41b. The light source 80 may be provided at an upper portion of the chamber 20 or a lateral side of the chamber 20. Further, the light source 80 may be fixed to an inner surface of the chamber 20 or embedded in an inner wall of the chamber 20.

Further, the light source 80 may radiate the light to a certain spot, that is, to the processing liquid L discharged from the nozzles 41a and 41b, or may radiate the light to the entire surface of the wafer W.

In the eleventh modification example, not only the noble metal film formed on the surface of the wafer W but a semiconductor film (for example, a DLC (Diamond-Like Carbon) film) formed on the surface of the wafer W can also be etched efficiently.

For the reason for this, by radiating the light having energy higher than a band gap of the semiconductor film, the semiconductor film can be turned into an excited state. Therefore, this semiconductor film can be etched photoelectrochemically.

Here, assuming that the band gap of the semiconductor film is E (eV) and a wavelength of the light radiated from the light source 80 is λ (nm), the semiconductor film on the surface of the wafer W can be etched by radiating the light having the wavelength which satisfies the following expression (1).

$$E \geq 1240/\lambda \quad (1)$$

In consideration of the above-specified expression (1), the light radiated from the light source 80 may be ultraviolet light in the eleventh modification example. By radiating the ultraviolet light having a small wavelength to the processing liquid L, even the semiconductor film such as the DLC film having a relatively large band gap can still be etched efficiently.

FIG. 17 is a diagram showing quality of the etching processing according to the eleventh modification example of the exemplary embodiment. FIG. 17 shows a result of etching the DLC film formed on the surface of the wafer W with TMAH.

As shown in FIG. 17, in the eleventh modification example, an etching rate of the DLC film is highest when the light is radiated to both the anode 61 side (that is, the processing liquid L discharged from the nozzle 41a) and the cathode 62 side (that is, the processing liquid L discharged from the nozzle 41b). Further, in the eleventh modification example, the DLC film can also be efficiently etched even when the light is radiated only to the anode 61 side.

Meanwhile, in the eleventh modification example, when the light is not radiated to the processing liquid L, the DLC film cannot be etched. Also, in the eleventh modification example, if the light is radiated only to the cathode 62 side, the DLC film cannot be photoelectrochemically etched, either.

That is, in the eleventh modification example, by radiating the light to at least the processing liquid L in contact with the anode 61, the semiconductor film can be photoelectrochemically etched.

Figure 18:
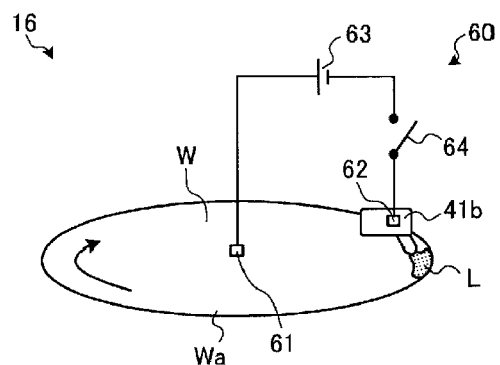
FIG. 18 is a diagram illustrating a configuration of a processing liquid supply and a voltage applying unit within a processing unit according to a twelfth modification example of the exemplary embodiment.

FIG. 18 is a diagram illustrating a configuration of a processing liquid supply 40 and a voltage applying unit 60 within a processing unit 16 according to a twelfth modification example of the exemplary embodiment. As depicted in FIG. 18, the twelfth modification example is different from the exemplary embodiment in that the anode 61 is in direct contact with the wafer W. In the twelfth modification example, the anode 61 is in contact with, for example, a center of the wafer W.

In this configuration as well, by applying a preset negative voltage to the processing liquid L discharged from the nozzle 41b, the noble metal film on the wafer W can be efficiently etched.

The substrate processing apparatus (substrate processing system 1) according to the exemplary embodiment is equipped with the substrate rotator 30, the processing liquid 40, the anode 61 and the cathode 62, and the controller 18. The substrate rotator 30 is configured to hold and rotate the substrate (wafer W). The processing liquid supply 40 is configured to supply the processing liquid L to the substrate (wafer W) held by the substrate rotator 30. The anode 61 and the cathode 62 are configured to apply the voltage to the processing liquid L supplied from the processing liquid supply 40. The controller 18 controls the individual components. Further, the controller 18 controls the anode 61 and the cathode 62 to come into contact with the processing liquid L independently, thus allowing the processing liquid L in contact with the anode 61 and the processing liquid L in contact with the cathode 62 to be supplied to the substrate (wafer W) while being spaced apart from each other. Accordingly, the noble metal film on the wafer W can be etched efficiently.

Further, the substrate processing apparats (substrate processing system 1) according to the exemplary embodiment is further equipped with the gas nozzle 70 configured to discharge the gas into the gap between the processing liquid L in contact with the anode 61 and the processing liquid L in contact with the cathode 62. Accordingly, the noble metal film on the wafer W can be etched more efficiently.

Furthermore, in the substrate processing apparatus (substrate processing system 1) according to the exemplary embodiment, at least one of the anode 61 or the cathode 62 is in direct or indirect contact with the processing liquid L retained by the liquid retaining member configured to retain the liquid. Accordingly, the consumption amount of the processing liquid L can be reduced.

Moreover, in the substrate processing apparatus (substrate processing system 1) according to the exemplary embodiment, the liquid retaining member is made of the porous member 66. Accordingly, the consumption amount of the processing liquid L can be reduced.

In addition, the substrate processing apparatus (substrate processing system 1) according to the exemplary embodiment is further equipped with the light source 80 configured to radiate the light to the processing liquid L. Accordingly, the semiconductor film or the like formed on the surface of the wafer W can also be etched efficiently.

Further, in the substrate processing apparatus (substrate processing system 1) according to the exemplary embodiment, the light source 80 radiates the light to the processing liquid L in contact with the anode 61. Accordingly, the semiconductor film can be photoelectrochemically etched.

Additionally, in the substrate processing apparatus (substrate processing system 1) according to the exemplary embodiment, the light source 80 radiates the ultraviolet light to the processing liquid L. Accordingly, even the semiconductor film such as the DLC film having the relatively large band gap can still be etched efficiently.

Furthermore, in the substrate processing apparatus (substrate processing system 1) according to the exemplary embodiment, the controller 18 controls both the processing liquid L in contact with the anode 61 and the processing liquid L in contact with the cathode 62 to be supplied to the peripheral portion Wa of the substrate (wafer W). Accordingly, the wafer W can be etched to be beveled.

<Processing Sequence>

Figure 19:
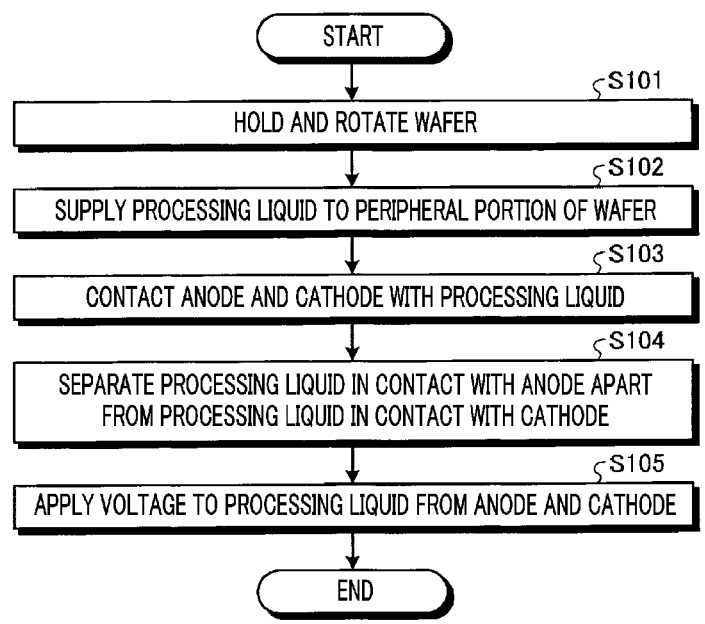
FIG. 19 is a flowchart illustrating a sequence of a substrate processing performed by the substrate processing system according to the exemplary embodiment.

Now, a sequence of a substrate processing according to the exemplary embodiment will be explained with reference to FIG. 19. FIG. 19 is a flowchart illustrating the sequence of the substrate processing performed by the substrate processing system 1 according to the exemplary embodiment.

First, the controller 18 controls the processing unit 16 or the like to hold and rotate the wafer W with the substrate holder 30 (process S101). Then, the controller 18 controls the processing liquid supply 40 or the like to supply the processing liquid L to the peripheral portion Wa of the wafer W (process S102).

Thereafter, the controller 18 controls the voltage applying unit 60 or the like to allow the anode 61 and the cathode 62 to be in contact with the processing liquid L supplied to the peripheral portion Wa of the wafer W (process S103). Then, the controller 18 controls the processing liquid supply 40 or the like to space the processing liquid L in contact with the anode 61 apart from the processing liquid L in contact with the cathode 62 (process S104).

Further, the processes S102 to S104 may be performed in any sequence without being limited to the above-specified sequence. The controller 18 controls the voltage applying unit 60 or the like to apply the voltage to the processing liquid L from the anode 61 and the cathode 62, thus completing the processing.

A substrate processing method according to the exemplary embodiment includes a rotating process (process S101), a supplying process (process S102), a contacting process (process S103), a separating process (process S104), and an applying process (process S105). In the rotating process (process S101), the substrate (wafer W) is held and rotated. In the supplying process (process S102), the processing liquid L is supplied to the substrate (wafer W). In the contacting process (process S103), the anode 61 and the cathode 62 are allowed to be in contact with the processing liquid L independently. In the separating process (process S104), the processing liquid L in contact with the anode 61 and the processing liquid L in contact with the cathode 62 are spaced apart from each other. In the applying process (process S105), the voltage is applied to the processing liquid L from the anode 61 and the cathode 62. Accordingly, the noble metal film on the wafer W can be etched efficiently.

So far, the exemplary embodiments of the present disclosure have been described. However, the present disclosure is not limited to the above-described exemplary embodiments, and various changes and modifications may be made without departing from the sprit and scope of the present disclosure. By way of example, in the above-described exemplary embodiments, the processing unit 16 may be further equipped with a device configured to heat the rear surface of the wafer W with warm water or the like. With this configuration, the peripheral portion Wa of the wafer W can be etched more efficiently.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to etch a noble metal film on the substrate efficiently.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
   a substrate rotator configured to hold and rotate a substrate;
   a processing liquid supply configured to supply a processing liquid to the substrate held by the substrate rotator;
   an anode and a cathode configured to apply a voltage to the processing liquid supplied from the processing liquid supply;
   a controller configured to control the substrate rotator, the processing liquid supply, and the anode and the cathode; and
   a gas nozzle configured to discharge a gas into a gap between the processing liquid in contact with the anode and the processing liquid in contact with the cathode,
   wherein the controller allows, by contacting the anode and the cathode with the processing liquid independently, the processing liquid in contact with the anode and the processing liquid in contact with the cathode to be supplied to the substrate while being spaced apart from each other when the substrate is rotated.

2. The substrate processing apparatus of claim 1,
   wherein at least one of the anode or the cathode is in direct or indirect contact with the processing liquid retained by a liquid retaining member.

3. The substrate processing apparatus of claim 1, further comprising:
   a light source configured to radiate light to the processing liquid.

4. The substrate processing apparatus of claim 3,
   wherein the light source radiates the light to the processing liquid in contact with the anode.

5. The substrate processing apparatus of claim 1,
   wherein the controller controls both the processing liquid in contact with the anode and the processing liquid in contact with the cathode to be supplied to a peripheral portion of the substrate.

6. The substrate processing apparatus of claim 1,
   wherein the liquid retaining member is made of a porous member.

7. A substrate processing apparatus, comprising:
   a substrate rotator configured to hold and rotate a substrate;
   a processing liquid supply configured to supply a processing liquid to the substrate held by the substrate rotator;
   an anode and a cathode configured to apply a voltage to the processing liquid supplied from the processing liquid supply; and a controller configured to control the substrate rotator, the processing liquid supply, and the anode and the cathode, wherein the controller allows, by contacting the anode and the cathode with the processing liquid independently, the processing liquid in contact with the anode and the processing liquid in contact with the cathode to be supplied to the substrate while being spaced apart from each other when the substrate is rotated, wherein at least one of the anode or the cathode is in direct or indirect contact with the processing liquid retained by a liquid retaining member, and the controller controls both the processing liquid in contact with the anode and the processing liquid in contact with the cathode to be supplied to a peripheral portion of the substrate.

8. The substrate processing apparatus of claim 7, further comprising:

a light source configured to radiate light to the processing liquid.

9. The substrate processing apparatus of claim 8, wherein the light source radiates the light to the processing liquid in contact with the anode.

10. The substrate processing apparatus of claim 9, wherein the light source radiates ultraviolet light to the processing liquid.

11. The substrate processing apparatus of claim 8, wherein the light source radiates ultraviolet light to the processing liquid.

12. A substrate processing method performed by using the substrate processing apparatus of claim 1, comprising:

holding and rotating the substrate;

supplying the processing liquid to the substrate;

contacting the anode and the cathode with the processing liquid independently;

separating the processing liquid in contact with the anode apart from the processing liquid in contact with the cathode;

applying the voltage to the processing liquid from the anode and the cathode;

discharging the gas into the gap between the processing liquid in contact with the anode and the processing liquid in contact with the cathode.

* * * * *